United States Patent [19]
Ardezzone

[11] Patent Number: 4,636,722
[45] Date of Patent: Jan. 13, 1987

[54] HIGH DENSITY PROBE-HEAD WITH ISOLATED AND SHIELDED TRANSMISSION LINES

[75] Inventor: Frank J. Ardezzone, Santa Clara, Calif.

[73] Assignee: Probe-Rite, Inc., San Jose, Calif.

[21] Appl. No.: 612,440

[22] Filed: May 21, 1984

[51] Int. Cl.$^4$ .................. G01R 1/06; G01R 31/02
[52] U.S. Cl. ..................... 324/158 P; 324/158 F
[58] Field of Search ........... 324/158 P, 158 F, 72.5, 324/73 PC; 333/238

[56] References Cited

U.S. PATENT DOCUMENTS

| | | | |
|---|---|---|---|
| 3,405,361 | 10/1968 | Kattner et al. | 324/158 P |
| 3,596,228 | 7/1971 | Reed, Jr. | 324/158 P |
| 3,832,632 | 8/1974 | Ardezzone | 324/158 P |
| 3,970,934 | 7/1976 | Aksu | 324/158 P |

Primary Examiner—Ernest F. Karlsen
Attorney, Agent, or Firm—Thomas E. Schatzel

[57] ABSTRACT

A test probe head assembly having a probe assembly comprising a plurality of probe arms with terminal probe-points mounted on a support member with means for transmitting electrical signals between an external signal source and the probe's arms. The probe-points are resiliently mounted on the probe assembly which is itself capable of deflection.

22 Claims, 15 Drawing Figures

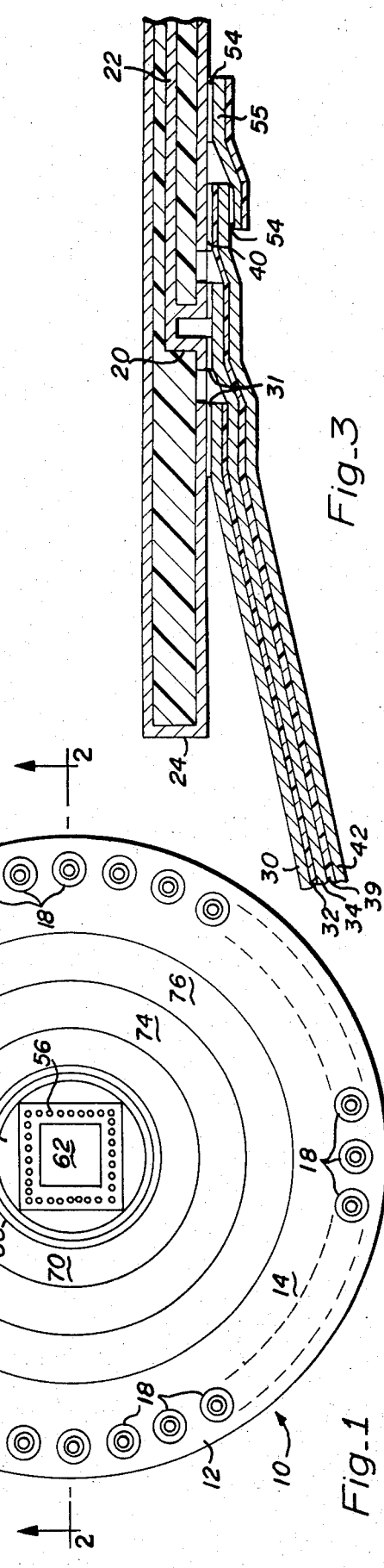
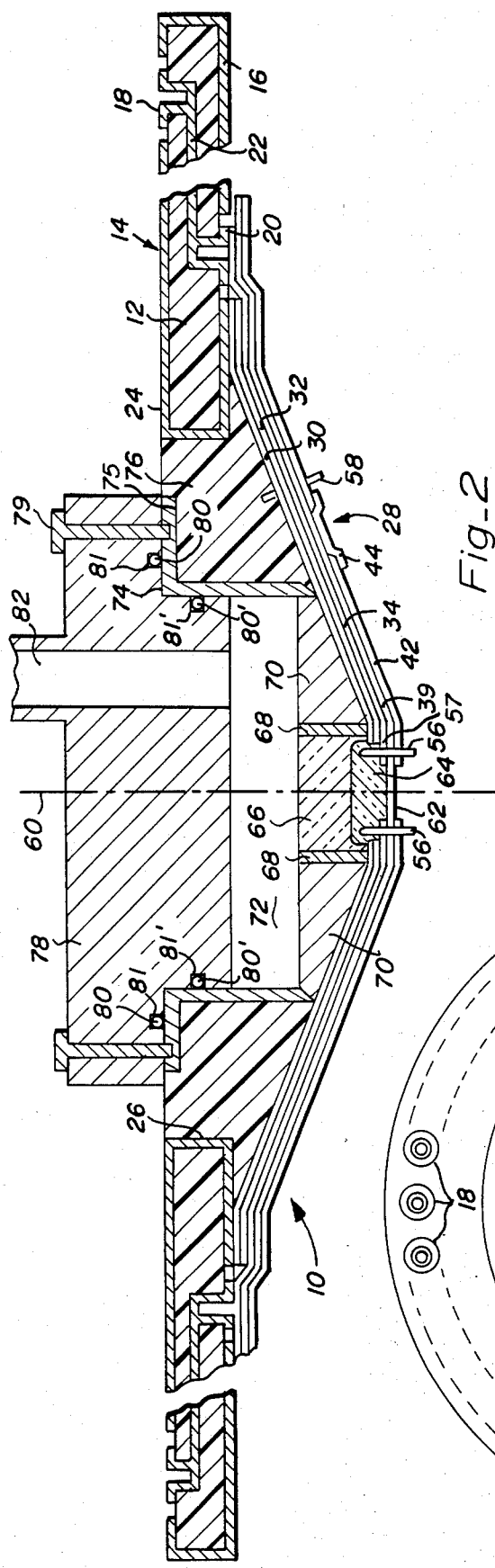
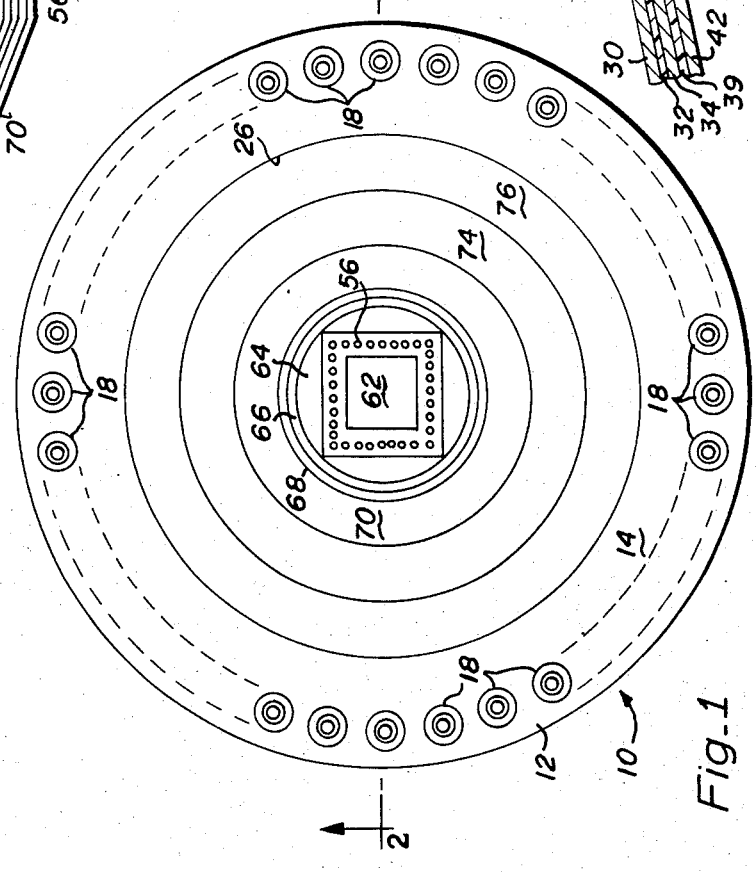

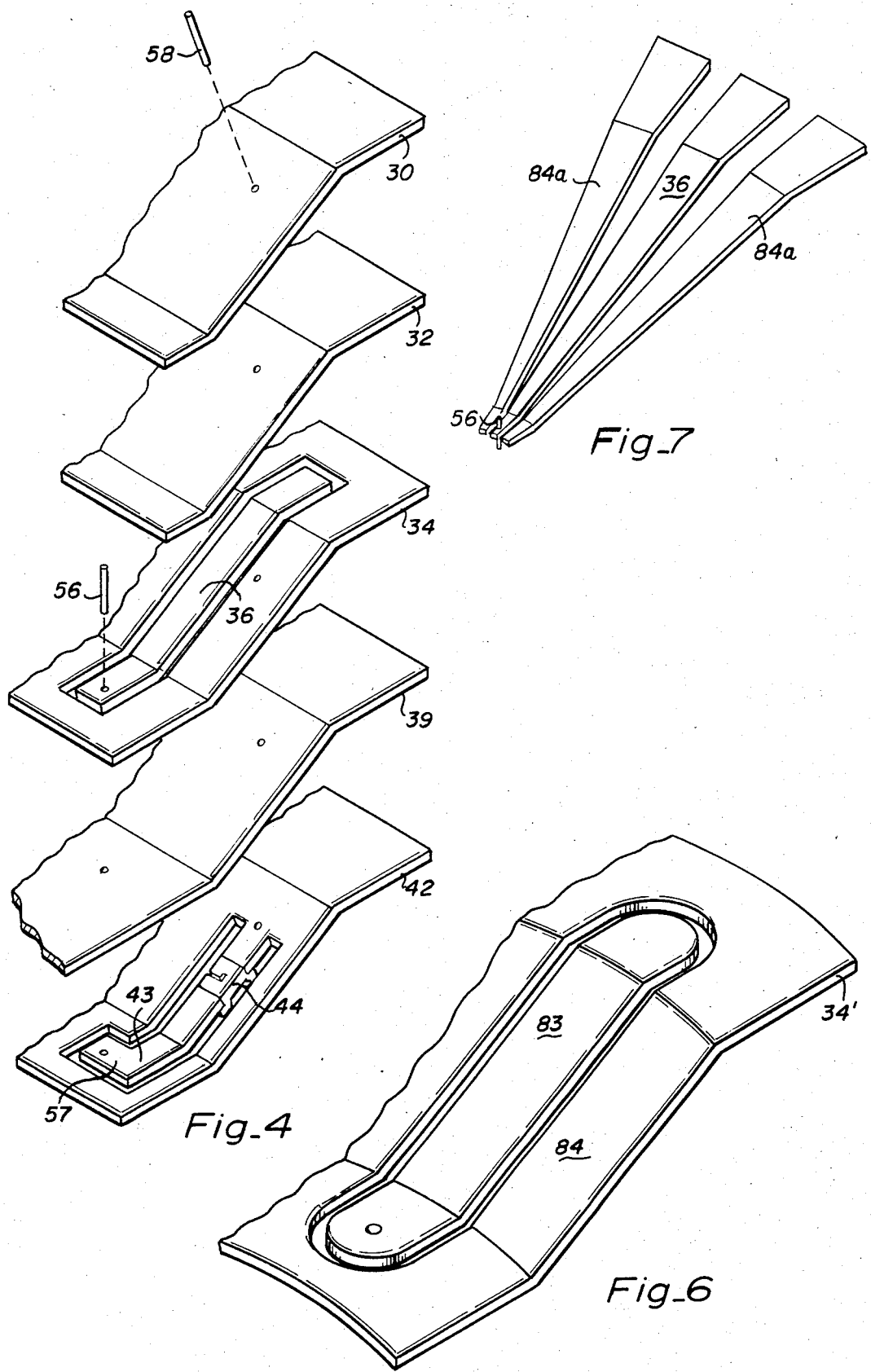

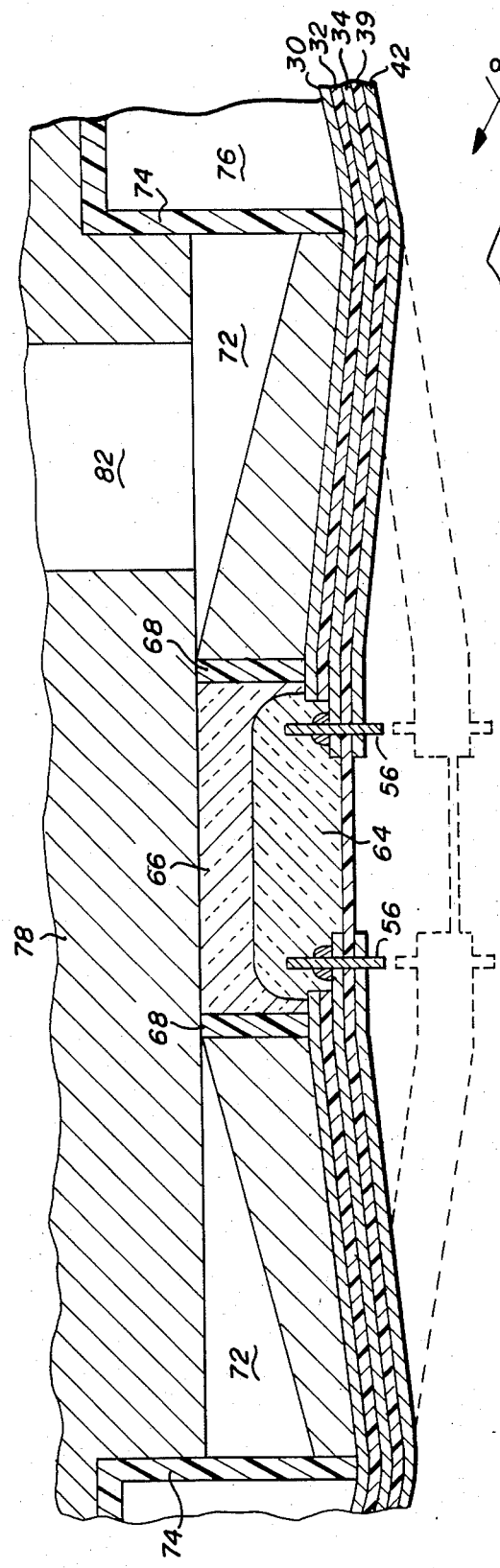
Fig_5
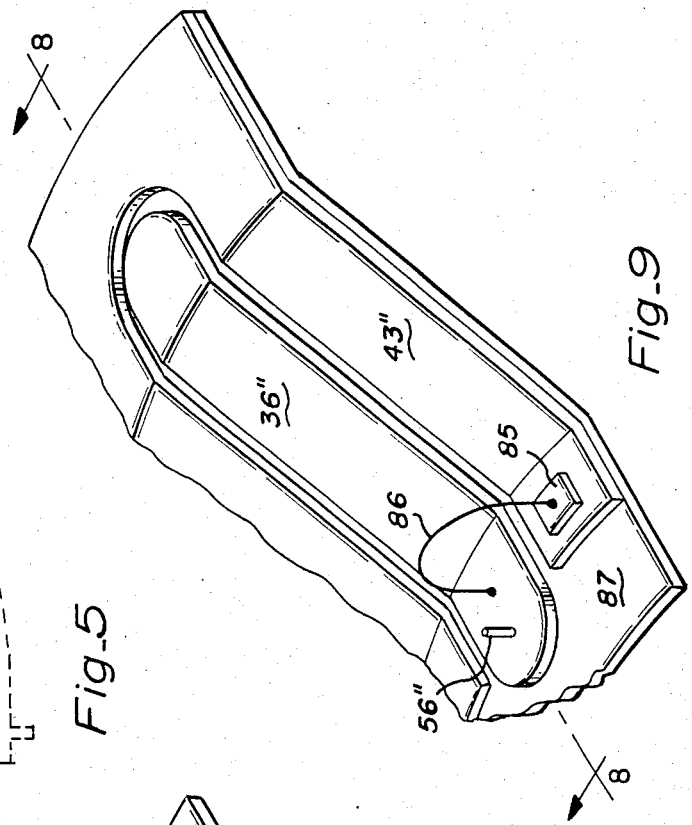
Fig_9
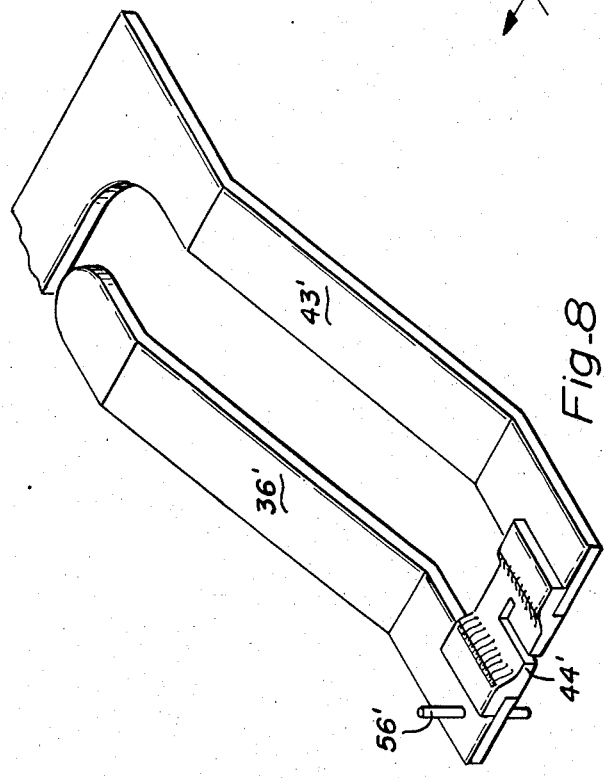
Fig_8

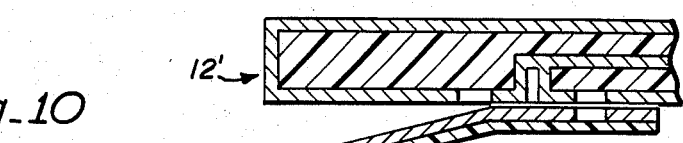
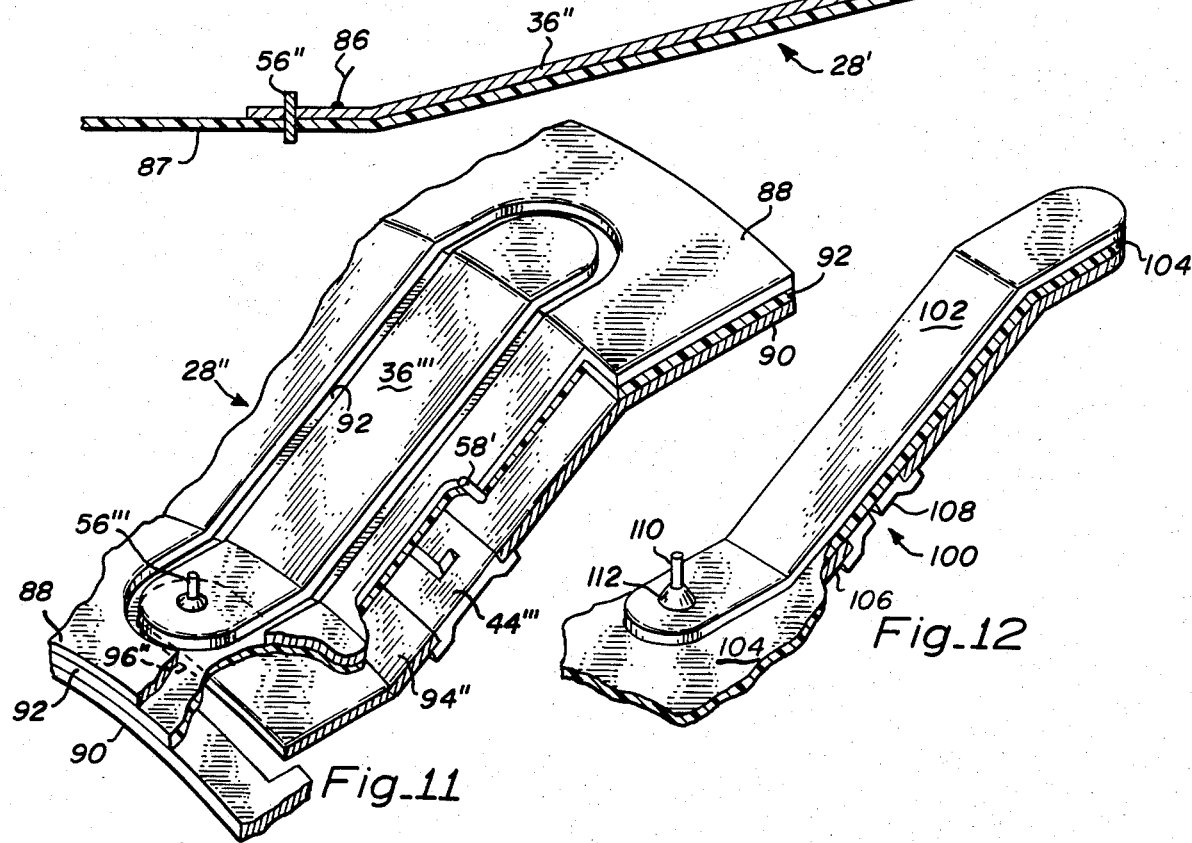
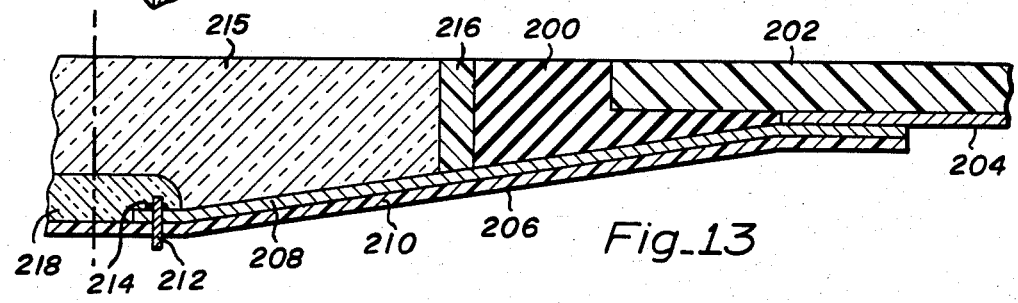
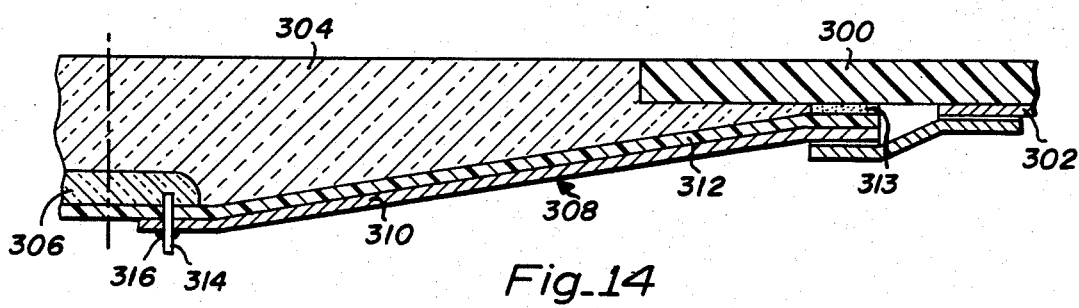

HIGH DENSITY PROBE-HEAD WITH ISOLATED AND SHIELDED TRANSMISSION LINES

BACKGROUND OF THE INVENTION

1. Field of the Invention

The invention relates generally to test probe heads and more particularly to high density probe heads using deformable technology with isolated signal lines.

2. Description of the Prior Art

Test probe heads are used in the semiconductor industry to transmit electrical test signals from a test system to and from electrical circuits on miniature electronic devices. By this process the circuitry of the electronic device can be tested during and after the manufacturing process and defective devices identified. The test probe heads are also used to test completed devices after receipt and may be used by a purchaser to check devices prior to inserting them into other assemblies.

Typically, the devices under test are rectangular dies on which a circuit has been implanted. Associated with such a die are a plurality of pads (usually between two and five mils square) which provide a means for electrical access to the circuit on the die. Test probe heads are generally mounted on a machine commonly referred to as a wafer probing machine. The testing operations include positioning a wafer or other electronic device to be tested on the chuck of the machine. With the machine in operation, the tip contacts of the probes are guided relative to the pads of the device under test to make the interface engagement of the tip contacts with the pads. Upon making interface contact, the electronic test equipment electrically coupled through the probe-head assembly evaluates the electrical operation of the device. When testing is complete the tested device is moved on relative to the probe-head assembly and another device is placed in position to repeat the testing operation.

In one type of wafer probing machine currently in use, the chuck is movable in a Z-axis by a fixed amount only, i.e. when actuated the chuck will move upward in the Z-axis a fixed distance, typically ten to twenty mils. The operator positions the probe-head above the wafer on the chuck at a predetermined distance. This distance is selected such that the fixed travel of the chuck will cause the pads of the device under test to just come into contact with the probe-points on the test head and then travel an additional distance to make proper electrical contact between the probe points and the pads. This additional movement is known as "overdrive". The purpose for "overdriving" the pads on the device under test beyond the point of initial contact is to ensure proper electrical contact between the probe tips and pads by making up for variations in wafer thickness over the surface of the wafer and differences in the coplanarity of the probe tips. The fixed amount of travel is set by the manufacturer of the machine while the "overdrive" is set by the user. The unadjustable nature of the travel of the chuck can create a problem. For example, if the operator initially places the probe-head too close to the chuck, the "overdrive" can damage the probe-points or the pad surfaces resulting in the inability to transmit test signals. Additionally, the rapid up and down motion of the chuck necessary for the efficient testing of a plurality of miniature electronic devices on the wafer creates vibrations which can cause the probe-points to oscillate up and down on the pads and thereby disrupt the testing process.

In another type of wafer probing machine currently in use, the distance of chuck travel in a Z-axis is automatically controllable. The machine senses when the probe-points are just touching the pads by means of an edge sensor and then the chuck's movement is continued upward a preprogrammed "overdrive" distance. Thus, the overdrive distance is the same every time even if the operator initially incorrectly sets a space between the probe-head and the device under test. However, the vibration problem discussed above continues to exist and provision must be made for vertical movement of the probe-points in response to the overdrive.

In general, any process which utilizes overdrive requires that the probe-points and/or probe arms be deflectable in the Z-axis to partially compensate for the overdrive motion and to prevent damage to the points and/or the pads, whether it is the movement of the wafer or the movement of the probe-head which causes the overdrive.

In the past test probe-heads have used thin wires as probes with the tip of the wire contacting the pads of the device under test. These wire tips act as springs to handle movement at least in the Z-axis and to maintain the necessary pressure on the pad for proper electrical connection. Several problems with such wire probes became evident. The wires were easily bent out of alignment. As the density of pads is increased it becomes necessary to reduce the wire size so that a greater number of wire probes can fit within the same area as before. However, the reduction in wire size results in the loss of mechanical strength such that the use of wire probes has become impractical in a high density situation when the wire size is very small (below six mils).

In U.S. Pat. No. 3,832,632 issued to the present applicant, a deformable probe-point which compensates for overdrive is disclosed. The probe arm is fixed with the probe-point being a hemispherical structure composed of an elastic compressable material. Particles of rhodium were suspended in the elastic conductive material to provide sharp edges to penetrate the oxide layer on a pad in order to ensure proper electrical contact and to provide a very large area of contact for use of high current when the point was compressed against the pad. While this structure was capable of providing electrical connection between a test device and a device under test, the probe-points were fairly fragile with respect to the adhesion of the elastic conductive material to the probe arms. The points were easily displaced thereby destroying the electrical contact between the signal line and pad.

Another approach to providing a probe which is deflectable in the Z-axis is by use of a probe mounted on a deflectable member. Such a device is disclosed in U.S. Pat. No. 3,405,361, issued to Lionel K. Kattner, et al. Kattner uses a fluid under pressure to expand a deflectable member downward bringing probes mounted thereon into contact with the device under test. A problem with this approach is that the fluid activation system tends to tear the flexible material comprising the deflectable member away from the rigid support member to which it is attached resulting in failure of the deflectable member. Another problem is that contact points are required to be plated onto the probes resulting in a hemispherical shape. Such hemispherical probe-points result in poor electrical contact. This poor electrical contact occurs because the surface of the hemispherical tips making contact with the device under test become flattened as a result of normal wear. This increases the area of the contact surface which means that for a given force, the pressure over the contact surface is decreased. As such pressure is decreased, contact resistance increases causing difficulties in getting test signals to and from the device under test. Another problem with such hemispherical probe-points is that they cannot be produced small enough or in the proper proportions to fit on a typical pad resulting in poor electrical contact therewith. Current fabrication techniques require the use of glass passivation which limits the target area for point contact on the pad.

Existing probes are unshielded making them susceptible to sources of electrical noise. Furthermore, the probe arms are not designed to match the impedance of the test system. As the frequency of the test signal increases (typically above five megahertz), the test signal tends to deteriorate. Such deterioration may be caused by external random electrical noise, cross talk between adjacent probe arms or by an impedance mismatch in the test line connecting the test device and the device under test. Even where impedance is matched, signal reflections can interfere with testing if the signal line is not properly terminated.

SUMMARY OF THE PRESENT INVENTION

It is therefore an object of the present invention to provide a test probe-head which can absorb overdrive without damaging the probe pins or pad surfaces.

It is a further object to provide a test probe-head which minimizes the vibrations associated with operation of a wafer probing machine.

It is a further object to provide a test probe-head with probe pins which are capable of proper electrical contact despite pin wear.

It is a further object to provide a test probe-head which varies pressure on the probe pins depending on the number of pins being used.

It is a further object to provide a test probe-head which eliminates the need for chuck movement in a wafer probing machine.

It is a further object to provide a test probe-head which saves time in the testing of devices.

It is a further object to provide a test probe-head which minimizes the tendency of a deflectable member to fail due to separation from a rigid support member to which it is attached.

It is a further object to provide a test probe-head which has probe pins sufficiently small to make proper contact with pads on a device under test.

It is a further object to provide a test probe-head which minimizes signal deterioration due to cross-talk between adjacent probe arms.

It is a further object to provide a test probe-head which minimizes signal deterioration due to external random electrical noise.

It is a further object to provide a test probe-head which matches the impedence of the probe arms and the impedance of the test system.

It is a further object to provide a test probe-head which minimizes signal deterioration due to signal reflection.

It is a further object to provide a test probe-head which has numerous signal termination modes, including device shield grounded, open shield and shield terminated.

Briefly, a preferred embodiment of the present invention includes a plurality of probe arms surrounded by but electrically isolated from an electrical shield except that any probe arm can be connected to the shield through a resistor. The probe arms and the shield are mounted on a planar support member. The support member has a plurality of signal terminals surrounded by a shielding member. Each probe arm is electrically connected to a signal terminal while the shield is electrically connected to the shielding member. The signal terminals receive test signals from a test device. The test signals are transmitted to a miniature electronic device under test through the probe arms to a probe-point which is in physical and electrical contact with a pad which is part of and connected to the circuit to be tested. An actuation system permits the probe-points to be moved into and out of contact with the pads.

An advantage of the test probe-head of the present invention is that overdrive can be absorbed without damaging the probe-points or pad surfaces.

Another advantage is that the test probe-head minimizes the vibrations associated with the operation of a wafer probing machine.

A further advantage is that the probe-points of the test probe head are capable of proper electrical contact despite pin wear.

A further advantage is that pressure on the probe-points is varied depending upon the number of points being used.

A further advantage is that the need for chuck movement in a wafer probing machine is eliminated.

A further advantage is that time is saved in the testing of devices using the test probe-head of the present invention.

A further advantage is that the tendency of a deflectible member to fail by separating from a rigid support member is minimized.

A further advantage is that the probe-points are sufficiently small to allow proper contact with the pads.

A further advantage is that signal deterioration due to cross-talk between adjacent probe arms is minimized.

A further advantage is that signal deterioration due to external random noise is minimized.

A further advantage is that the impedance of the probe arms can be matched to the impedance of the test system.

A further advantage is that signal deterioration due to signal reflection is minimized.

A further advantage is that the test probe-head provides numerous signal termination modes including grounded, open and terminated.

IN THE DRAWING

FIG. 1 is a top view of a high density probe-head in accordance with the present invention;

FIG. 2 is a cross-sectional view of the high density probe-head taken along line 2—2 of FIG. 1;

FIG. 3 is an enlarged cross-sectional view of the junction between the probe assembly and the planar support member of FIG. 2;

FIG. 4 is an exploded prospective view of the probe assembly of FIG. 3;

FIG. 5 is a detail view of the probe-head of FIG. 2 showing deflection of the probe assembly.

FIG. 6 is a perspective view of an alternative embodiment of a probe arm and shielding;

FIG. 7 is a perspective view of an alternative embodiment of a probe arm and shield arms;

FIG. 8 is a perspective view of an alternate embodiment of a probe arm;

FIG. 9 is a perspective view of a second alternative embodiment of a probe arm;

FIG. 10 is a cross-sectional view of the probe arm of FIG. 9 taken along line 8—8 as connected to a planar support member;

FIG. 11 is a perspective view of an alternative embodiment of the probe assembly of FIG. 4;

FIG. 12 is a perspective view of a third alternative embodiment of a probe arm;

FIG. 13 is a partial cross-sectional view of a second alternative embodiment of the present invention;

FIG. 14 is a partial cross-sectional view of a third alternative embodiment of the present invention; and FIG. 15 is a cross-sectional view of an alternative embodiment of a probe-point.

DETAILED DESCRIPTION OF THE PREFERRED EMBODIMENT

In FIG. 1, there is illustrated a probe-head assembly referred to by the general reference numeral 10 and incorporating the present invention. The probe-head assembly 10 includes a planar support member 12. The planar support member 12 may be a printed circuit board, ceramic board or other single or multi-layer type. Planar support member 12 has an upper surface 14 and a lower surface 16 (see FIG. 2). The upper surface 14 has a plurality of upper signal terminals 18. The upper signal terminals are electrically connected to a plurality of lower signal terminals 20 (see FIG. 2) by a plurality of signal lines 22. The remainder of the surface of planar support member 12 may be covered with a conductive layer 24 which is electrically isolated from the upper and lower signal terminals 18 and 20 and signal lines 22.

Planar support member 12 has a central opening 26. Connected to the lower surface 16 in a manner discussed below is a probe assembly referred to by general reference numeral 28. The probe assembly 28 extends into the central opening 26 at a slight angle from the plane of planar support member 12. The probe assembly 28 includes a first conductive foil layer 30 which is electrically connected to the conductive layer 24 on the lower surface 16 of planar support member 12 as illustrated in FIG. 3. Solder 31 or an electrically conductive adhesive may be used to make the connection. Immediately below first conductive foil layer 30 is a first nonconductive flexible film layer 32. Below film layer 32 is a second conductive foil layer 34. As shown in FIG. 4, foil layer 34 is adapted to form a plurality of probe arms 36. Probe arms 36 may be arranged as radial spokes about the center of central opening 26. Each probe arm 36 is electrically connected to a single lower signal terminal 20 by a solder 31 or other conductive adhesive means.

Immediately below foil layer 34 is a second nonconductive flexible film layer 39. Film layer 39 is affixed to conductive layer 24 using an adhesive 40. Under film layer 39 is a third conductive foil layer 42. Foil layer 42 is electrically connected to conductive layer 24 using a solder 54 or conductive adhesive and interconnect strip 55 or other conductive means such as wire bonding techniques. Foil layer 42 is adapted to form a plurality of shield arms 43 of FIG. 4. A resistor element 44 may be used to connect shield arm 43 to the remainder of foil layer 42. Resistor element 44 may be formed by vapor deposition via a mask and/or etching. It may also be fabricated by plating with masking. The final step in producing the resistor element 44 is laser or abrasive trimming.

Each probe arm 36 has a probe-point 56 passing through and electrically connected at a terminal end 57 and extending below third conductive foil layer 42. Probe-point 56 makes electrical contact with shield arm 43 which provides a return path to ground through resistor element 44. Probe-points 56 are cylindrical in shape with their longitudinal axes perpendicular to the plane of probe arm 36 at terminal ends 57. A feed through pin 58 passes through layers 30, 32, 34 (in ground plane), 39 and 43 and is in electrical contact with first conductive foil layer 30, second conductive foil layer 34 (in the ground plane) and third conductive foil layer 42. The pin 56 is connected to ground through the resistor 44 via foil layer 42 and shield arm 43.

As shown in FIGS. 1 and 2, layers 30, 32, 34 and 42 terminate short of a center line 60 of probe-head assembly 10 creating a central area 62. As shown in FIG. 2, the central area 62 is covered by second nonconductive flexible film layer 39 which is transparent. However, first nonconductive flexible film layer 32 may also cover central area 62 either alone or with film layer 39.

A central flexible member 64 covers the upper ends of probe-points 56 and that portion of film layer 39 within central area 62. Central flexible member 64 may be a coating of resiliently deformable material and should be transparent to permit observation of probe-points 56. Above central flexible member 64 is a central rigid member 66 which is also transparent. Surrounding central rigid member 66 is a first separator collar 68. Surrounding separator collar 68 is an opaque intermediate flexible member 70. Above central rigid member 66, separator collar 68 and intermediate flexible member 70 is a stroke adjustment chamber 72. Surrounding intermediate flexible member 70 and stroke adjustment chamber 72 is a second separator collar 74 which has a flanged portion 75. Surrounding second separator collar 74 is an outer rigid member 76 which is in contact with planar support member 12. An actuation system interface fitting 78 is mounted on the flanged portion 75 by a plurality of fasteners 79 which seal fitting 78 to separator collar 74 by an O-ring 80 in groove 81. Alternatively an O-ring 80' in groove 81' may be used to produce the seal. The lower surface of fitting 78 forms the upper boundary of chamber 72 and provides a seating surface for central rigid member 66 during operation of the actuation system (not shown). The actuation system is connected to chamber 72 by a conduit 82 through fitting 78. The actuation system (not shown) operates to create either a vacuum or pressure in chamber 72 depending on the operation of probe-head assembly 10 desired. The actuation system may be part of the probe-head assembly 10 or it may be a part of a wafer probing machine with the necessary connections to the chamber 72. The central flexible member 64, the central and outer rigid members 66 and 76, the first and second separator collars 68 and 74 and the opaque intermediate flexible member 70 are typically constructed of nonconductive material.

Initially, the actuation system puts chamber 72 under a vacuum which draws central rigid member 66 towards the lower surface of interface fitting 78. This motion is possible because intermediate flexible member 70 is able to deform. As central rigid member 66 moves upward probe-points 56 are also drawn upward and a portion of probe assembly 28 adjacent intermediate flexible member 70 is deflected. As shown in FIG. 5 the upward motion of probe-points 56 is terminated when central rigid member 66 reaches the lower surface of fitting 78. With the probe-head assembly 10 mounted in an appropriate device, probe-head assembly 10 is positioned over a miniature electronic device such that the probe-points 56 are above contact pads associated with the electronic device such that probe-points 56 will just be in contact with the pads when probe head assembly 10 returns to its normal position which is illustrated in FIG. 2. The actuation system is then activated to remove the vacuum and create a pressure. With the probe-head assembly in its normal position the pressure loads the probe-points 56 to make proper electrical contact with the pads. This pressure causes only minor deflection of the probe assembly 28.

A small amount of movement of the probe-points 56 is permitted in the direction of their longitudinal axes. This is accomplished by the compression of the central flexible member 64 which allows the points to move upward deflecting probe assembly 28 proximate to the probe-points 56. Such movement of probe-points 56 compensates for minor variations in point length and pad height without damaging the points 56 or the pads.

Due to the cylindrical shape of probe points 56, the points 56 maintain a uniform cross section despite wear which means that the pressure on a point remains constant for a given force exerted thereon throughout its life. Thereafter, test signals generated by an electronic test system are introduced to probe head assembly 10 through upper signal terminals 18. The test signal is then transmitted to the miniature electronic device via the signal lines 22, lower signal terminals 20 to probe arms 36 to probe-points 56. The structure of probe assembly 28 is such that the signal is protected from cross-talk between adjacent probe arms 36 and from deterioration and interference caused by impedance mismatch or other sources. This is accomplished by surrounding probe arms 36 with shielding in the form of first, second and third conductive foil layers 30, 34 and 42 insulated from each other by first and second nonconductive flexible film layers 32 and 39. The shielding minimizes signal deterioration caused by external random electrical noise. The shielding can be geometrically arranged such that the impedance of the probe assembly 28 can be matched with that of the electronic test system generating test signals. Resistor elements 44 are used to connect probe points 56 to the ground plane which prevents signal reflection and ringing. It should be noted that the position of the resistor element 44 with respect to probe-point 56 is important and it is desirable to have resistor element 44 located as close as possible to probe-point 56.

When testing is complete, the actuation system 78 is operated to place chamber 72 under a vacuum and thereby moving probe pins 56 out of contact with the pads on the device under test as previously described.

The probe assembly 28 can vary in the number and position of the various conductive and nonconductive layers. The simplest configuration is where the probe assembly 28 comprises only probe arms 36 without first and third conductive foil layers 30 and 42. In such a configuration the nonconductive flexible film layer (32 or 39) may be above or below the conductive layer 34 as desired.

Other configurations of probe assembly 28 may be used such as conductive layer 34 with flexible film layer 39 and conductive layer 42 or conductive layer 34 with flexible film layer 32 and conductive layer 30. In addition, resistor element 44 may be omitted as appropriate.

As shown in FIG. 6, a conductive layer 34' may be adapted to form a probe arm 83 and a shield arm 84. Additionally, the probe arms 36 and a plurality of shield arms 84A may be configured as shown in FIG. 7. The configurations of FIGS. 6 and 7 may be used as part of probe assembly 28.

In FIG. 8 there is illustrated an alternative embodiment of a probe arm and shield arm. In this configuration a resistor element 44' provides the electrical connection between a probe arm 36' and a shield arm 43'. The location of the resistor 44' in proximity to probe pin 56' minimizes signal deterioration due to unterminated shield reflections.

In FIG. 9 there is illustrated a second alternative embodiment of the present invention which includes a probe arm 36" with a probe-point 56" and a shield arm 43". A chip resistor 85 is soldered or otherwise electrically affixed onto shield arm 43". A wire 86, one end of which is welded or thermo-compression bonded or soldered to chip resistor 85 and the other end which is similarly affixed to probe arm 36", electrically connects probe arm 43" and probe arm 36" through chip resistor 85. The result is the same as discussed above where the signal is terminated through resistor 43.

A probe assembly 28' is illustrated in FIG. 10 showing probe arm 36" with chip resistor 85 (not visible) mounted on a planar support member 12'. A nonconductive flexible film 87 located under probe arm 36" and shield arm 43" is similar to first or second nonconductive flexible film layers 32 or 39 described above in connection with probe assembly 28.

In FIG. 11, a alternative embodiment of the present invention is illustrated which includes a probe assembly 28". Probe arm and shield assembly 28" has an upper conductive foil layer 88 and a lower conductive foil layer 90 with an intermediate nonconductive film layer 92 between layers 88 and 90 which electrically isolates layers 88 and 90 from each other. Upper layer 88 is adapted to form a probe arm 36''' which is surrounded by but not in electrical contact with the remainder of upper layer 88. The remainder of upper layer 88 serves as an electrical shield for probe arm 36'''. The configuration of upper layer 88 is the same as second conductive foil layer 34 in probe assembly 28 as shown in FIG. 4.

Lower layer 90 is adapted to form a shield arm 94" with an extension piece 96" and a resistor element 44'''. Probe assembly 28" also, includes a probe-point 56''' and a feed through conductor 58' which functions as previously described for probe-point 56 and feed-through 58. Probe assembly 28" is in effect probe assembly 28 with first conductive layer 30 and first nonconductive flexible film layer 32 removed and functions in a manner previously described to provide shielding for a signal transmitted over probe arm 36''' and to terminate that shielding through a resistor element 44".

An alternative probe arm assembly 100 illustrated in FIG. 12 includes a probe arm 102, a nonconductive flexible film layer 104 and a shield arm 106 which may be adapted to include a resistor element 108. A probe-point 110 is in electrical contact with probe arm 102 and shield arm 106 using a solder 112 or other conductive bonding material.

A fourth alternative embodiment of the present invention illustrated in FIG. 13 shows an outer flexible member 200 connected to a planar support member 202.

The support member 202 is of similar construction and configuration as previously discussed for support member 12. Support member 202 has a conductive layer 204 to which a probe assembly 206 is mechanically and electrically connected. Probe assembly 206 includes a plurality of probe arms 208, a nonconductive flexible film layer 210 and a plurality of probe-points 212 and a solder 214 or other conductive bonding material. It should be noted that any of the various probe assembly configurations discussed herein may be used with the embodiment shown in FIG. 13. The fourth alternative embodiment further includes an inner rigid member 215, a separator 216 and a central flexible member 218.

Central flexible member 218 allows the probe-points 212 a small amount of movement along their longitudinal axes. However, if additional force is exerted on probe points 212, outer flexible member 200 allows deflection of probe assembly 206 to absorb such force. This configuration may be used with a fixed Z-axis wafer probing machine. Additionally, such a configuration may be used with actuation system 78 to provide movement of probe pins 212 as previously described.

Illustrated in FIG. 14 is a fifth alternative embodiment of the present invention which is similar to the embodiments shown in FIGS. 2 and 13 except that the intermediate flexible member 70 and outer flexible member 200 are not present. The fifth embodiment includes a planar support member 300, a conductive layer 302, a rigid member 304, a central flexible member 306, and a probe assembly 308 comprising a plurality of probe arm 310, a nonconductive flexible film layer 312, an adhesive 313 and a plurality of probe pins 314 and a solder 316 or other conductive adhesive material. It should again be noted that probe assembly 308 may be in the form of any of the various configurations discussed and described herein.

As described previously central flexible member 306 premits a limited amount of movement of probe pins 314 along their longitudinal axes. The fifth embodiment may be used with a wafer probing machine in which the Z-axis movement of the machine's chuck is automatically controllable and selector setable. This feature permits the proper adjustment of overdrive to yield the desired probe-point pressure for the number of probe-points used.

In place of the probe pins 56, 56', 56'', 56''', 212 and 314, a probe-point 400 may be used as illustrated in FIG. 15. Probe-point 400 is generally hemispherical in shape and is electrically connected to a probe arm 402 at its terminal end 404. Probe-point 400 may be constructed of an electrically conductive material which may be deformable or rigid.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

I claim:

1. A test probe-head assembly comprising:
 a planar support member provided with a plurality of signal terminals and having a central opening;
 a probe assembly including a plurality of electrically conductive probe arms mounted on the support member and extending into said central opening with each probe arm electrically connected to one of said signal terminals, a terminal end of each probe arm being adapted to provide a probe-point, and a nonconductive flexible film layer, in abutting and adhering contact with the probe arms, mechanically connected to the planar support member and extending into and across said central opening;
 a central flexible member mounted on the upper surface of the probe assembly and covering said probe points to allow minor deflection of each individual probe-point to compensate for minor variations in probe-point length and the height of probe pads of a device to be tested;
 a central rigid member located above and in abutting contact with the central flexible member and a portion of the upper surface of the probe assembly adjacent thereto, to prevent the deformation of the flexible member and to keep said probe-points approximately co-planar; and
 an intermediate flexible member mounted above and in abutting contact with a portion of the probe assembly, intermediate and connected to the central rigid member and the support member, to allow for major deflection of said probe-points, the central flexible member, and the central rigid member.

2. The device of claim 1, further including,
 a chamber formed and sealed above the central rigid member and the intermediate flexible member; and
 a means for alternately subjecting the chamber to a pressure or vacuum.

3. The device of claim 1, wherein,
 the central flexible member, the central rigid member, and the intermediate flexible member are connected to form a semi-rigid member such that the intermediate flexible member and the central flexible member will not touch the surface of a die to be tested when pressure is applied to the top surface of the central rigid member and the intermediate flexible member.

4. The device of claim 2, further including,
 a rigid separator collar connected intermediate the central rigid member and the intermediate flexible member such that the upper surfaces of the collar and the central rigid member provide a planar stop against the upper surface of the chamber when the chamber is under a vacuum.

5. The device of claim 1, wherein,
 said probe-points are cylindrical pins.

6. The device of claim 1, wherein,
 said probe-points are constructed of an electrically conductive material and are generally hemispherical in shape.

7. The device of claim 1 further including,
 a means for electrically shielding said probe arms; and
 wherein the planar support member has a conductive shield surrounding the signal terminals, but electrically isolated therefrom.

8. The device of claim 7, wherein,
 said shield means is arranged about said probe arms as to match the impedance of said probe arms to a predetermined fixed value.

9. The device of claim 7, wherein,
 said probe arms are individually electrically connected to said conductive shield of the planar support member through a resistor means.

10. The device of claim 7, wherein, the shielding means further includes a plurality of conductive shield arms electrically connected to the conductive shield of the planar support member and arranged to alternate with the probe arms.

11. The device of claim 10, wherein,
the shield means further includes a conductive layer in electrical contact with and mounted on said conductive shield of the planar support member, the conductive layer being electrically insulated from the probe arms by the nonconductive flexible film layer, but being electrically connected to said shield arms.

12. The device of claim 10, wherein,
the shield means further includes an upper conductive layer and a lower conductive layer in electrical contact with and mounted on said conductive shield of the planar support member, the upper layer being electrically insulated from the probe arms by a second nonconductive flexible film layer and the lower layer being electrically insulated from the probe arms by the nonconductive flexible film layer, both upper and lower layers being in electrical contact with said shield arms.

13. A test probe-head assembly, comprising:
a planar support member provided with a plurality of signal terminals and having a central opening;
a probe assembly including a plurality of electrically conductive probe arms mounted on the planar support member and extending into said central opening with each probe arm electrically connected to one of said signal terminals, a terminal end of each probe arm being adapted to provide a probe-point and a nonconductive flexible film layer in abutting and adhering contact with the probe arms, mechanically connected to the planar support member and extending into and across said central opening;
a central flexible member mounted on the upper surface of the probe assembly and covering said probe-points to allow for minor deflection of each individual probe—point to compensate for minor variations in probe—point length and the height of probe pads of a device to be tested; and
a rigid member occupying said central opening above the probe assembly and the central flexible member being in abutting contact with the probe assembly and the central flexible member and rigidly connected to the planar support member, to prevent the deformation of the central flexible member and to keep said probe-points approximately co-planar.

14. The device of claim 13, wherein,
the central flexible member and the rigid member are connected to form a semi-rigid member such that the central flexible member will not touch the surface of a die to be tested when pressure is applied to the top surface of the rigid member.

15. The device of claim 13, wherein,
said probe-points are cylindrical pins.

16. The device of claim 13, wherein,
said probe-points are constructed of an electrically conductive material and are generally hemispherical in shape.

17. The device of claim 13, further including,
a means for electrically shielding said probe arms; and
wherein the planar support member has a conductive shield surrounding the signal terminals, but electrically isolated therefrom.

18. The device of claim 17, wherein,
said shield means are arranged about said probe arms as to match the impedance of said probe arms to a predetermined fixed value.

19. The device of claim 17, wherein,
said probe arms are individually electrically connected to aid conductive shield of the planar support member through a resistor means.

20. The device of claim 17, wherein,
the shield means further includes a plurality of conductive shield arms electrically connected to the conductive shield of the planar support member and arranged to alternate with the probe arms.

21. The device of claim 20, wherein,
the shield means further includes a conductive layer in electrical contact with and mounted on said conductive shield of the planar support member, the conductive layer being electrically insulated from the probe arms by the nonconductive flexible film layer, but being electrically connected to said shield arms.

22. The device of claim 20, wherein,
the shield means further includes an upper conductive layer and a lower conductive layer in electrical contact with and mounted on said conductive shield of the planar support member, the upper layer being electrically insulated from the probe arms by a second nonconductive flexible film layer and the lower layer being electrically insulated from the probe arms by the nonconductive flexible film layer, both upper and lower layers being in electrical contact with said shield arms.

* * * * *